US011873556B2

(12) United States Patent
Kimoto et al.

(10) Patent No.: US 11,873,556 B2
(45) Date of Patent: Jan. 16, 2024

(54) RAW MATERIAL SUPPLY APPARATUS AND FILM FORMING APPARATUS

(71) Applicant: Tokyo Electron Limited, Tokyo (JP)

(72) Inventors: Tomohisa Kimoto, Nirasaki (JP); Noriyuki Watanabe, Nirasaki (JP); Kensaku Narushima, Nirasaki (JP); Kouichi Sekido, Nirasaki (JP); Takuya Kawaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 344 days.

(21) Appl. No.: 17/229,799

(22) Filed: Apr. 13, 2021

(65) Prior Publication Data

US 2021/0324513 A1 Oct. 21, 2021

(30) Foreign Application Priority Data

Apr. 17, 2020 (JP) ................................ 2020-074360

(51) Int. Cl.
*G05D 7/06* (2006.01)
*G05D 23/12* (2006.01)
(Continued)

(52) U.S. Cl.
CPC ........ *C23C 16/448* (2013.01); *C23C 16/4412* (2013.01); *C23C 16/45544* (2013.01);
(Continued)

(58) Field of Classification Search
CPC ......... Y10T 137/2605; Y10T 137/2622; Y10T 137/2635; Y10T 137/264; C23C 16/448;
(Continued)

(56) References Cited

U.S. PATENT DOCUMENTS 4,394,871 A * 7/1983 Czajka ............... G05D 16/2053
137/624.11
5,460,196 A * 10/1995 Yonnet ............... G05D 16/2095
137/487

(Continued)

FOREIGN PATENT DOCUMENTS

CN 108531889 A 9/2018
JP 2002-164320 A 6/2002
(Continued)

OTHER PUBLICATIONS

Translation of KR-20180101186-A, Korea, 2018.*

*Primary Examiner* — William M McCalister
(74) *Attorney, Agent, or Firm* — Armstrong Teasdale LLP

(57) ABSTRACT

A raw material supply apparatus includes: a raw material supply path through which a raw material gas is supplied into a processing container; a valve provided in the raw material supply path; a pressure sensor configured to detect an internal pressure of the raw material supply path; a raw material exhaust path connected to the raw material supply path and through which the raw material gas in the raw material supply path is exhausted; an opening degree adjustment mechanism provided in the raw material exhaust path and configured to control the internal pressure of the raw material supply path based on an adjustment of an opening degree of the opening degree adjustment mechanism; and a controller configured to perform the adjustment of the opening degree of the opening degree adjustment mechanism based on a value detected by the pressure sensor.

14 Claims, 4 Drawing Sheets

(51) Int. Cl.
- *H01L 21/67* (2006.01)
- *F16K 21/00* (2006.01)
- *C23C 16/448* (2006.01)
- *C23C 16/44* (2006.01)
- *C23C 16/52* (2006.01)
- *C23C 16/455* (2006.01)
- *G05D 23/20* (2006.01)
- *F16K 24/04* (2006.01)

(52) U.S. Cl.
CPC ........ *C23C 16/45561* (2013.01); *C23C 16/52* (2013.01); *F16K 24/04* (2013.01); *G05D 7/0629* (2013.01); *G05D 23/12* (2013.01); *G05D 23/2037* (2013.01); *H01L 21/67017* (2013.01); *F16K 21/00* (2013.01)

(58) Field of Classification Search
CPC .......... C23C 16/4412; C23C 16/45544; C23C 16/52; C23C 16/45557; C23C 16/45561; F16K 24/04; F16K 21/00; G05D 7/0629; G05D 23/12; G05D 23/2037; H01L 21/67017
USPC .............. 137/115.13, 115.18, 115.23, 115.25
See application file for complete search history.

(56) References Cited

U.S. PATENT DOCUMENTS

| | | | | |
|---|---|---|---|---|
| 5,806,553 A | * | 9/1998 | Sidwell | G05D 16/2013 137/489.5 |
| 2003/0183156 A1 | * | 10/2003 | Dando | C23C 16/45544 117/84 |
| 2005/0265868 A1 | * | 12/2005 | Scheffel | F04B 53/143 417/572 |
| 2012/0071001 A1 | * | 3/2012 | Ode | C23C 16/448 438/758 |
| 2018/0251894 A1 | | 9/2018 | Yamaguchi et al. | |
| 2019/0287808 A1 | * | 9/2019 | Goradia | H01J 37/32422 |
| 2020/0115801 A1 | * | 4/2020 | Wakabayashi | C23C 16/455 |
| 2021/0324513 A1 | * | 10/2021 | Kimoto | C23C 16/4412 |
| 2022/0178029 A1 | * | 6/2022 | Obata | C23C 16/45565 |
| 2022/0260171 A1 | * | 8/2022 | Margol | F16K 31/005 |

FOREIGN PATENT DOCUMENTS

| | | | | |
|---|---|---|---|---|
| JP | 2016134569 A | | 7/2016 | |
| JP | 2019-052346 A | | 4/2019 | |
| KR | 20180101186 A | * | 10/2018 | ....... H01L 21/28556 |

* cited by examiner

RAW MATERIAL SUPPLY APPARATUS AND FILM FORMING APPARATUS

CROSS-REFERENCE TO RELATED APPLICATION

This application is based upon and claims the benefit of priority from Japanese Patent Application No. 2020-074360, filed on Apr. 17, 2020, the entire contents of which are incorporated herein by reference.

TECHNICAL FIELD

The present disclosure relates to a raw material supply apparatus and a film forming apparatus.

BACKGROUND

In a case in which a film is formed by intermittently supplying a raw material gas into a processing container to form a film, a technique that intermittently exhausts the processing container without supplying the raw material gas into the processing container prior to the film formation is known (see, for example, Patent Document 1).

PRIOR ART DOCUMENT

Patent Document

Patent Document 1: Japanese Laid-Open Patent Publication No. 2019-052346

SUMMARY

According to one embodiment of the present disclosure, there is provided a raw material supply apparatus that includes: a raw material supply path through which a raw material gas is supplied into a processing container; a valve provided in the raw material supply path; a pressure sensor configured to detect an internal pressure of the raw material supply path; a raw material exhaust path connected to the raw material supply path and through which the raw material gas in the raw material supply path is exhausted; an opening degree adjustment mechanism provided in the raw material exhaust path and configured to control the internal pressure of the raw material supply path based on an adjustment of an opening degree of the opening degree adjustment mechanism; and a controller configured to perform the adjustment of the opening degree of the opening degree adjustment mechanism based on a value detected by the pressure sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
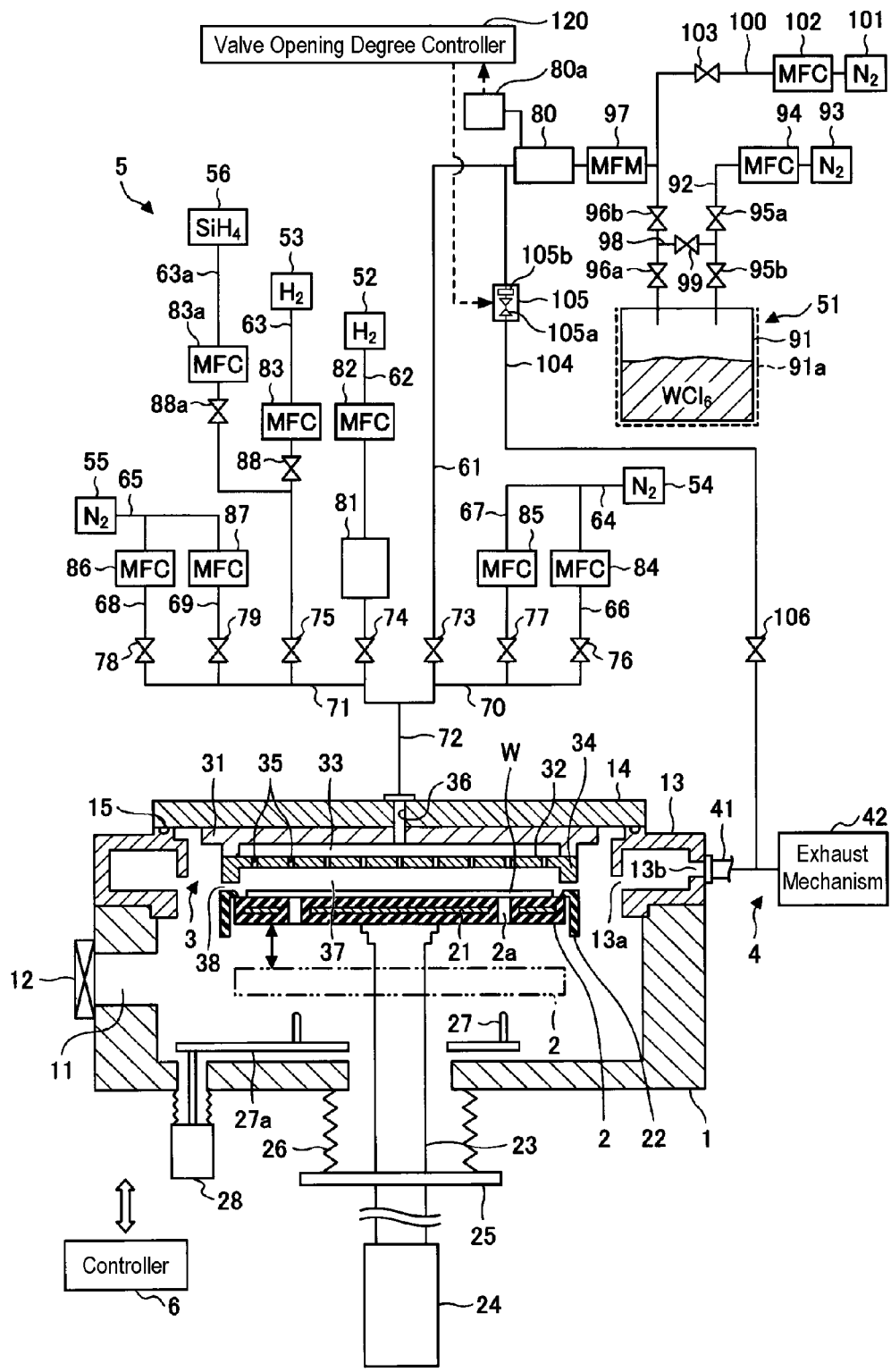
FIG. 1 is a schematic view illustrating an example of a film forming apparatus including a raw material supply apparatus according to an embodiment.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

An example of a film forming apparatus including a raw material supply apparatus according to an embodiment will be described with reference to FIG. 1. FIG. 1 is a schematic view illustrating an example of the film forming apparatus including the raw material supply apparatus according to an embodiment. The film forming apparatus according to the embodiment is configured as an apparatus capable of forming a film through an atomic layer deposition (ALD) method and a chemical vapor deposition (CVD) method.

The film forming apparatus includes a processing container 1, a stage 2, a shower head 3, an exhauster 4, a gas supplier 5, a controller 6, a valve opening degree controller 120, and the like.

The processing container 1 is made of a metal such as aluminum, and has a substantially cylindrical shape. The processing container 1 accommodates a semiconductor wafer (hereinafter, referred to as a "wafer W") which is an example of a substrate. A loading/unloading port 11 through which the wafer W is loaded or unloaded is formed in a sidewall of the processing container 1. The loading/unloading port 11 is opened or closed by a gate valve 12. An annular exhaust duct 13 having a rectangular cross section is provided on a main body of the processing container 1. A slit 13a is formed in the exhaust duct 13 along an inner peripheral surface of the exhaust duct 13. An exhaust port 13b is formed in an outer wall of the exhaust duct 13. On an upper surface of the exhaust duct 13, a ceiling wall 14 is provided so as to close an upper opening of the processing container 1. A space between the exhaust duct 13 and the ceiling wall 14 is hermetically sealed with a seal ring 15.

The stage 2 horizontally supports the wafer W inside the processing container 1. The stage 2 has a circular shape larger than that of the wafer W, and is made of a ceramic material, such as aluminum nitride (AlN), or a metallic material, such as aluminum or a nickel-based alloy. A heater 21 is embedded inside the stage 2 to heat the wafer W. The heater 21 generates heat by being supplied with power from a heater power supply (not illustrated). The wafer W is controlled to have a predetermined temperature by controlling the output of the heater 21 based on a temperature signal of a thermocouple (not illustrated) provided in the vicinity of the upper surface of the stage 2. The stage 2 is provided with a cover member 22 formed of ceramic, such as alumina, so as to cover an outer peripheral area of the upper surface of the stage 2 and a lateral surface thereof.

The stage 2 is supported by a support member 23. The support member 23 extends downward from the processing container 1 through a hole formed in a bottom wall of the processing container 1 from the center of a bottom surface of the stage 2. A lower end of the stage 2 is connected to a lifting mechanism 24. By the lifting mechanism 24, the stage 2 is raised and lowered between a processing position illustrated in FIG. 1 and a transfer position (indicated by a one-dot chain line below the processing position) at which the wafer W can be transferred. Below the processing container 1, a flange 25 is mounted on the support member 23. A bellows 26 is provided between the bottom surface of the processing container 1 and the flange 25. The bellows 26 isolates an internal atmosphere of the processing container 1 from ambient air and is flexible with the vertical movement of the stage 2.

Three wafer support pins 27 (of which only two are illustrated) are provided in the vicinity of the bottom surface of the processing container 1 so as to protrude upward from an elevating plate 27a. The wafer support pins 27 are moved up and down via the elevating plate 27a by a lifting mechanism 28 provided below the processing container 1. The wafer support pins 27 are inserted into respective through-holes 2a provided in the stage 2 located at the transfer position and are configured to move up and down on the upper surface of the stage 2. By raising and lowering the wafer support pins 27, the wafer W is delivered between a transfer robot (not illustrated) and the stage 2.

The shower head 3 supplies a processing gas into the processing container 1 in the form of a shower. The shower head 3 is made of, for example, a metallic material and is arranged so as to face the stage 2. The shower head 3 has substantially the same diameter as the stage 2. The shower head 3 includes a body 31 and a shower plate 32. The body 31 is fixed to a bottom surface of the ceiling wall 14. The shower plate 32 is connected under the body 31. A gas diffusion space 33 is provided between the body 31 and the shower plate 32. The gas diffusion space 33 is provided with a gas introduction hole 36 formed to penetrate the center of the ceiling wall 14 and the body 31. An annular protruded portion 34 protruding downward is formed on a peripheral portion of the shower plate 32. A plurality of gas ejection holes 35 are formed in a flat inner surface of the annular protruded portion 34 of the shower plate 32.

In the state in which the stage 2 is moved to the processing position, a processing space 37 is formed between the stage 2 and the shower plate 32, and the upper surface of the cover member 22 and the annular protruded portion 34 are close to each other so that an annular gap 38 is formed.

The exhauster 4 evacuates the inside of the processing container 1. The exhauster 4 includes an exhaust pipe 41 and an exhaust mechanism 42. The exhaust pipe 41 is connected to the exhaust port 13b. The exhaust mechanism 42 is connected to the exhaust pipe 41, and includes a vacuum pump, a pressure control valve, and the like. The exhaust mechanism 42 exhausts the gas from the processing container 1 through the exhaust duct 13 and the exhaust pipe 41.

The gas supplier 5 supplies various gases to the shower head 3. The gas supplier 5 includes a raw material gas supply mechanism 51, a first reduction gas source 52, a second reduction gas source 53, a first purge gas source 54, a second purge gas source 55, and a third reduction gas source 56.

The raw material gas supply mechanism 51 supplies a tungsten hexachloride ($WCl_6$) gas, which is an example of a raw material gas, into the processing container 1 through the gas supply line 61. The gas supply line 61 is a raw material supply path extending from the raw material gas supply mechanism 51.

A valve 96a, a valve 96b, a flowmeter 97, a storage tank 80, and a valve 73 are provided in the gas supply line 61 in that order from the side of the raw material gas supply mechanism 51.

The valves 96a and 96b are provided in the vicinity of a film-forming raw material tank 91 in the gas supply line 61.

The flowmeter 97 detects a flow rate of the $WCl_6$ gas flowing through the gas supply line 61. The flowmeter 97 is, for example, a mass flowmeter (MFM).

The storage tank 80 temporarily stores the $WCl_6$ gas. Since the storage tank 80 is provided, it is possible to supply a large flow rate of $WCl_6$ gas into the processing container 1 in a short time. The storage tank 80 is also referred to as a "buffer tank" or a "fill tank". The storage tank 80 is provided with a pressure sensor 80a configured to detect an internal pressure of the storage tank 80. The pressure sensor 80a detects the internal pressure of the storage tank 80 and transmits the detected value to the valve opening degree controller 120. The pressure sensor 80a is, for example, a capacitance manometer.

The valve 73 is a valve for switching between supply and cutoff of gas during ALD. The valve 73 is, for example, an ALD valve capable of being opened and closed at high speed. Preferably, the ALD valve may be opened and closed at an interval of 0.5 seconds or less. More preferably, the ALD valve may be opened and closed at an interval of 0.01 seconds or less.

The raw material gas supply mechanism 51 includes a film-forming raw material tank 91. The film-forming raw material tank 91 contains $WCl_6$, which is a solid raw material that is solid at normal temperature. A heater 91a is provided around the film-forming raw material tank 91. The heater 91a heats $WCl_6$ in the film-forming raw material tank 91 to an appropriate temperature so as to sublimate $WCl_6$. When $WCl_6$ is sublimated, a $WCl_6$ gas is generated. A gas supply line 61 is inserted into the film-forming raw material tank 91 from above.

In the raw material gas supply mechanism 51, one end of a carrier gas pipe 92 is inserted into the film-forming raw material tank 91 from above. The other end of the carrier gas pipe 92 is connected to a carrier gas source 93. The carrier gas source 93 supplies a $N_2$ gas, which is an example of a carrier gas, to the carrier gas pipe 92.

A flow controller 94, a valve 95a, and a valve 95b are provided in the carrier gas pipe 92 in that order from the side of the carrier gas source 93. The flow controller 94 controls a flow rate of the $N_2$ gas flowing through the carrier gas pipe 92. The flow controller 94 is, for example, a mass flow controller (MFC).

A bypass pipe 98 is provided so as to connect a position between the valve 95a and the valve 95b in the carrier gas pipe 92 and a position between the valve 96a and the valve 96b in the gas supply line 61. The bypass pipe 98 is a pipe for supplying the $N_2$ gas as a carrier gas, which is supplied from the carrier gas source 93 to the carrier gas pipe 92, to the gas supply line 61 without passing through the film-forming raw material tank 91. The bypass pipe 98 is provided with a valve 99. By closing the opening/closing valves 95b and 96a and opening the opening/closing valves 95a, 99, and 96b, the $N_2$ gas, which is supplied from the carrier gas source 93, is supplied to the gas supply line 61 via the carrier gas pipe 92 and the bypass pipe 98. This makes it possible to purge the gas supply line 61.

One end of a dilution gas supply line 100 through which a $N_2$ gas, which is an example of a dilution gas, is supplied, joins between the valve 96b and the flowmeter 97 in the gas supply line 61. At the other end of the dilution gas supply line 100, a dilution gas source 101, which is a source of the $N_2$ gas, is provided. A flow controller 102 and a valve 103 are provided in the dilution gas supply line 100 in that order from the side of the dilution gas source 101. The flow controller 102 controls a flow rate of the $N_2$ gas flowing through the dilution gas supply line 100. The flow controller 102 is, for example, a mass flow controller (MFC).

One end of a raw material exhaust path 104 is connected between the storage tank 80 and the valve 73 in the gas supply line 61. The other end of the raw material exhaust path 104 is connected to the exhaust pipe 41. This makes it possible to exhaust the inside of the storage tank 80 via the raw material exhaust path 104 using the exhaust mechanism 42. The raw material exhaust path 104 is also referred to as an "evacuation line".

An opening degree adjustment mechanism 105 and a valve 106 are provided in the raw material exhaust path 104 in that order from the gas supply line 61 side.

The opening degree adjustment mechanism 105 adjusts an opening degree to control conductance of the raw material exhaust path 104 and control the flow rate of the $WCl_6$ gas flowing through the raw material exhaust path 104. As a result, an internal pressure of the gas supply line 61 including the storage tank 80 is controlled. The opening degree of the opening degree adjustment mechanism 105 is controlled by the valve opening degree controller 120. The opening degree adjustment mechanism 105 includes an air-operated valve 105a and an electro-pneumatic regulator 105b. The air-operated valve 105a controls the conductance of the raw material exhaust path 104 by opening and closing a valve body by air pressure. The air-operated valve 105a is also called an "air operation valve". The electro-pneumatic regulator 105b controls an air pressure to be introduced into the air-operated valve 105a in proportion to an electric signal output by the valve opening degree controller 120. In the case in which the opening degree adjustment mechanism 105 includes the air-operated valve 105a and the electro-pneumatic regulator 105b as described above, it is possible to open and close the valve in a short time, and thus it is possible to shorten a delay time associated with the opening and closing of the valve. In addition, the air-operated valve 105a is preferably an ALD valve that is capable of being opened and closed at high speed particularly from the viewpoint of shortening the delay time. Preferably, the ALD valve is capable of being opened and closed at an interval of 0.5 seconds or less. More preferably, the ALD valve is capable of being opened and closed at an interval of 0.01 seconds or less. The opening degree adjustment mechanism 105 may include a manual valve having a valve body that is opened and closed when a handle is rotated, and a motor configured to rotate the handle of the manual valve.

The valve 106 is a valve for opening and closing the raw material exhaust path. By opening the valve 106, the inside of the raw material exhaust path 104 is exhausted by the exhaust mechanism 42.

The first reduction gas source 52 supplies a hydrogen ($H_2$) gas, which is an example of the reduction gas, into the processing container 1 via the gas supply line 62. The gas supply line 62 is a line extending from the first reduction gas source 52. The gas supply line 61 and the gas supply line 62 are joined with a joint pipe 72. The joint pipe 72 is connected to the gas introduction hole 36. A flow controller 82, a storage tank 81, and a valve 74 are provided in the gas supply line 62 in that order from the side of the first reduction gas source 52.

The flow controller 82 controls a flow rate of the $H_2$ gas flowing through the gas supply line 62. The flow controller 82 is, for example, a mass flow controller (MFC).

The storage tank 81 temporarily stores the $H_2$ gas. Since the storage tank 81 is provided, it is possible to supply a large flow rate of $H_2$ gas into the processing container 1 in a short time. The storage tank 81 is also referred to as a "buffer tank" or a "fill tank".

The valve 74 is a valve for switching between supply and cutoff of gas during ALD. The valve 74 is, for example, an ALD valve capable of being opened and closed at high speed. Preferably, the ALD valve is openable/closable at an interval of 0.01 seconds to 1.0 second.

The second reduction gas source 53 supplies a $H_2$ gas, which is an example of the reduction gas, into the processing container 1 via the gas supply line 63. The gas supply line 63 is a line extending from the second reduction gas source 53. A flow controller 83, a storage tank 88, and a valve 75 are provided in the gas supply line 63 in that order from the side of the second reduction gas source 53. The flow controller 83 controls a flow rate of the $H_2$ gas flowing through the gas supply line 63. The flow controller 83 is, for example, a mass flow controller (MFC). The valve 88 and the valve 74 are valves for switching between supply and cutoff of gas during ALD. The valve 88 and the valve 74 are, for example, ALD valves capable of being opened and closed at high speed. Preferably, the ALD valves are openable/closable at an interval of 0.01 seconds to 1.0 second.

The first purge gas source 54 supplies a $N_2$ gas, which is an example of the purge gas, into the processing container 1 via the gas supply line 64. The gas supply line 64 is a line extending from the first purge gas source 54 to supply the $N_2$ gas toward the gas supply line 61. The gas supply line 64 is branched into a gas supply line 66, which constantly supplies the $N_2$ gas during film formation through the ALD method, and a gas supply line 67, which supplies the $N_2$ gas only during the purging step. The gas supply line 66 and the gas supply line 67 are connected to a first connection line 70. The first connection line 70 is connected to the gas supply line 61. A flow rate controller 84 and a valve 76 are provided in the gas supply line 66 in that order from the side of the first purge gas source 54. A flow controller 85 and a valve 77 are provided in the gas supply line 67 in that order from the side of the first purge gas source 54. The flow rate controllers 84 and 85 control the flow rates of the $N_2$ gases flowing through the gas supply lines 66 and 67, respectively. The flow rate controllers 84 and 85 are, for example, mass flow controllers (MFCs). The valves 76 and 77 are valves for switching between supply and cutoff of gas during ALD. The valves 76 and 77 are, for example, ALD valves capable of being opened and closed at high speed. Preferably, the ALD valves are openable/closable at an interval of 0.01 seconds to 1.0 seconds.

The second purge gas source 55 supplies a $N_2$ gas, which is an example of the purge gas, into the processing container 1 via the gas supply line 65. The gas supply line 65 is a line extending from the second purge gas source 55 to supply the $N_2$ gas toward the gas supply line 62. The gas supply line 65 is branched into a gas supply line 68, which constantly supplies the $N_2$ gas during film formation through the ALD method, and a gas supply line 69, which supplies the $N_2$ gas only during the purging step. The gas supply line 68 and the gas supply line 69 are connected to a second connection line 71. The second connection line 71 is connected to the gas supply line 62. A flow rate controller 86 and a valve 78 are provided in the gas supply line 68 in that order from the side of the second purge gas source 55. A flow rate controller 87 and a valve 79 are provided in the gas supply line 69 in that order from the side of the second purge gas source 55. The flow rate controllers 86 and 87 control the flow rates of the $N_2$ gases flowing through the gas supply lines 68 and 69, respectively. The flow rate controllers 86 and 87 are, for example, mass flow controllers (MFCs). The valves 78 and 79 are valves for switching between supply and cutoff of gas during ALD. The valves 78 and 79 are, for example, ALD valves capable of being opened and closed at high speed. Preferably, the ALD valves are openable/closable at an interval of 0.01 seconds to 1.0 seconds.

The third reduction gas source 56 supplies a mono silane ($SiH_4$) gas, which is an example of the reduction gas, into the processing container 1 via a gas supply line 63a. The gas supply line 63a extends from the third reduction gas source 56 and is connected to the gas supply line 63. A flow controller 83a and a valve 88a are provided in the gas supply line 63a in that order from the side of the third reduction gas source 56. The flow controller 83a controls a flow rate of the $SiH_4$ gas flowing through the gas supply line 63a. The flow controller 83a is, for example, a mass flow controller (MFC).

The controller 6 includes a process controller including a microprocessor (a computer) for controlling each component, specifically, a valve, a power supply, a heater, a pump, or the like, a user interface, and a storage part. Each component of the film forming apparatus is electrically connected to the process controller and is controlled by the process controller. The user interface is connected to the process controller, and includes a keyboard on which an operator performs an operation to input commands in order to manage each component of the film forming apparatus, a display configured to visually display the operation situation of each component of the film forming apparatus, and the like. The storage part is also connected to the process controller. The storage part stores control programs for implementing various processes executed by the film forming apparatus under the control of the process controller, and control programs for causing each component of the film forming apparatus to execute a predetermined process according to processing conditions, that is, processing recipes, various databases, and the like. The processing recipes are stored in a storage medium (not illustrated) in the storage part. The storage medium may be, for example, a hard disc, a CD-ROM, a DVD, or a semiconductor memory. In addition, the processing recipes may be appropriately transmitted from another device via, for example, a dedicated line. If necessary, a predetermined processing recipe is called from the storage part by an instruction from the user interface or the like and executed by the process controller so that a desired process in the film forming apparatus is performed under the control of the process controller.

The valve opening degree controller 120 adjusts the opening degree of the opening degree adjustment mechanism 105 based on a value detected by the pressure sensor 80a, that is, the internal pressure of the storage tank 80 (hereinafter, also referred to as "tank pressure"). For example, the valve opening degree controller 120 adjusts the opening degree of the opening degree adjustment mechanism 105 such that the value of the internal pressure detected by the pressure sensor 80a reaches a target value and the internal pressure is stabilized (in a steady state) while exhausting the $WCl_6$ gas through the raw material exhaust path 104 without supplying the $WCl_6$ gas into the processing container 1. The target value is determined based on, for example, the value detected by the pressure sensor 80a when the $WCl_6$ gas is supplied into the processing container 1 and the processing is executed in the processing container 1.

[Film Forming Method]

Figure 2:
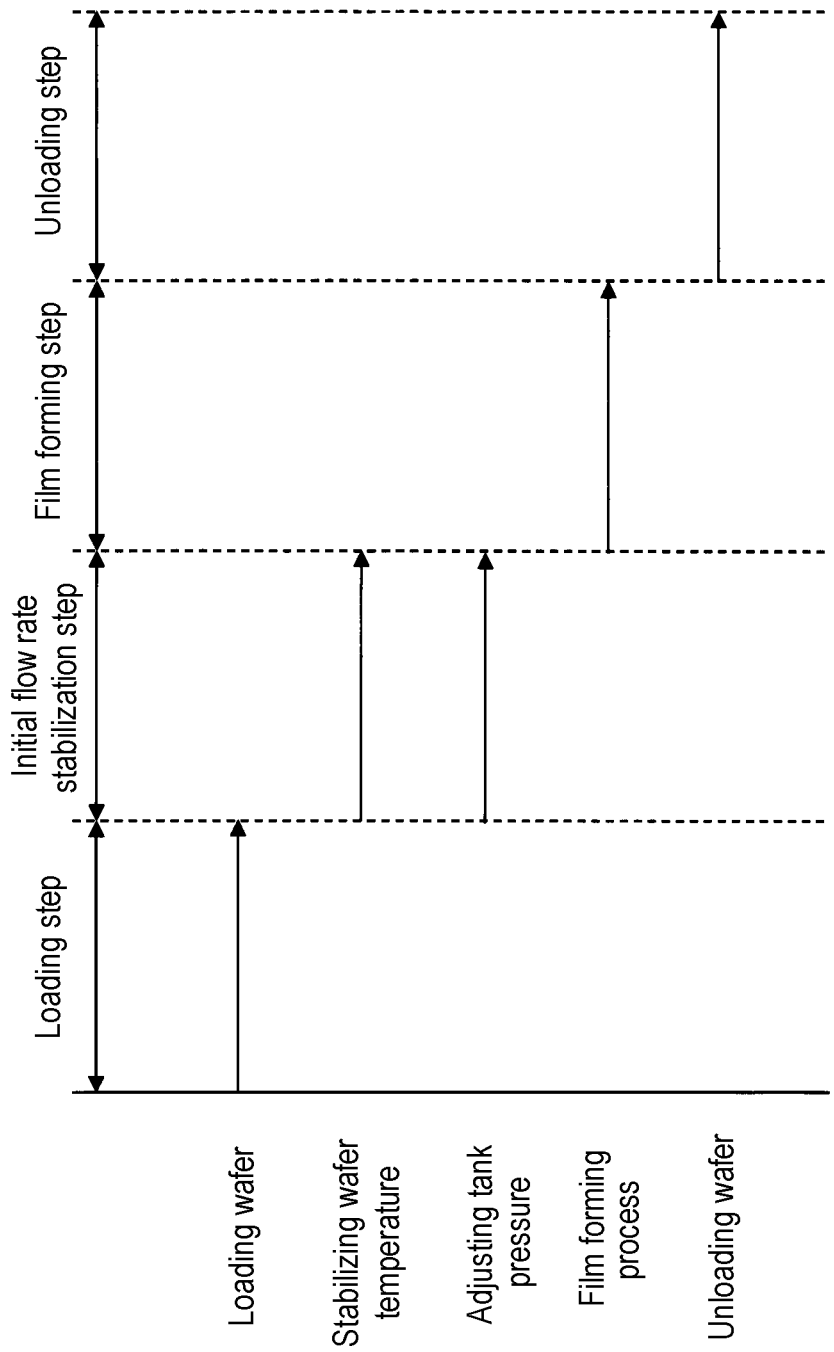
FIG. 2 is a view illustrating an example of a film forming method according to the embodiment.

With reference to FIGS. 1 to 4, a case in which a tungsten film is formed on the wafer W through the ALD method using the film forming apparatus illustrated in FIG. 1 will be described as an example of the film forming method according to the embodiment. FIG. 2 is a view illustrating an example of the film forming method according to the embodiment.

As illustrated in FIG. 2, the film forming method of the embodiment includes a loading step, an initial flow rate stabilization step, a film formation step, and an unloading step. In the following description, it is assumed that, before the loading step is started, the valves 73 to 79, 88, 88a, and 99 of the film forming apparatus remain closed, the valves 95a, 95b, 96a, 96b, 103, and 106 remain opened, and the opening degree adjustment mechanism 105 remains "fully closed".

In the loading step, the wafer W is loaded into the processing container 1. In the loading step, the gate valve 12 is opened in the state in which the stage 2 is lowered to the transfer position, and the wafer W is loaded into the processing container 1 through the loading/unloading port 11 by a transfer robot (not illustrated) and is placed on the stage 2 heated to a predetermined temperature by the heater 21. Subsequently, the stage 2 is raised to the processing position, and the inside of the processing container 1 is depressurized to a predetermined pressure.

The initial flow rate stabilization step is executed after the loading step is completed. In the initial flow rate stabilization step, the temperature of the wafer W on the stage 2 is stabilized. For example, by opening the valves 76 and 78, the $N_2$ gas is supplied into the processing container 1 from the first purge gas source 54 and the second purge gas source 55 so as to raise the internal pressure of the processing container 1, and the temperature of the wafer W on the stage 2 is stabilized.

In addition, in the initial flow rate stabilization step, the opening degree of the opening degree adjustment mechanism 105 is adjusted such that the internal pressure of the storage tank 80 reaches a target value and is stabilized (in a steady state) while the $WCl_6$ gas is exhausted through the raw material exhaust path 104 without supplying the $WCl_6$ gas into the processing container 1. The internal pressure of the storage tank 80 is detected by the pressure sensor 80a.

Figure 3:
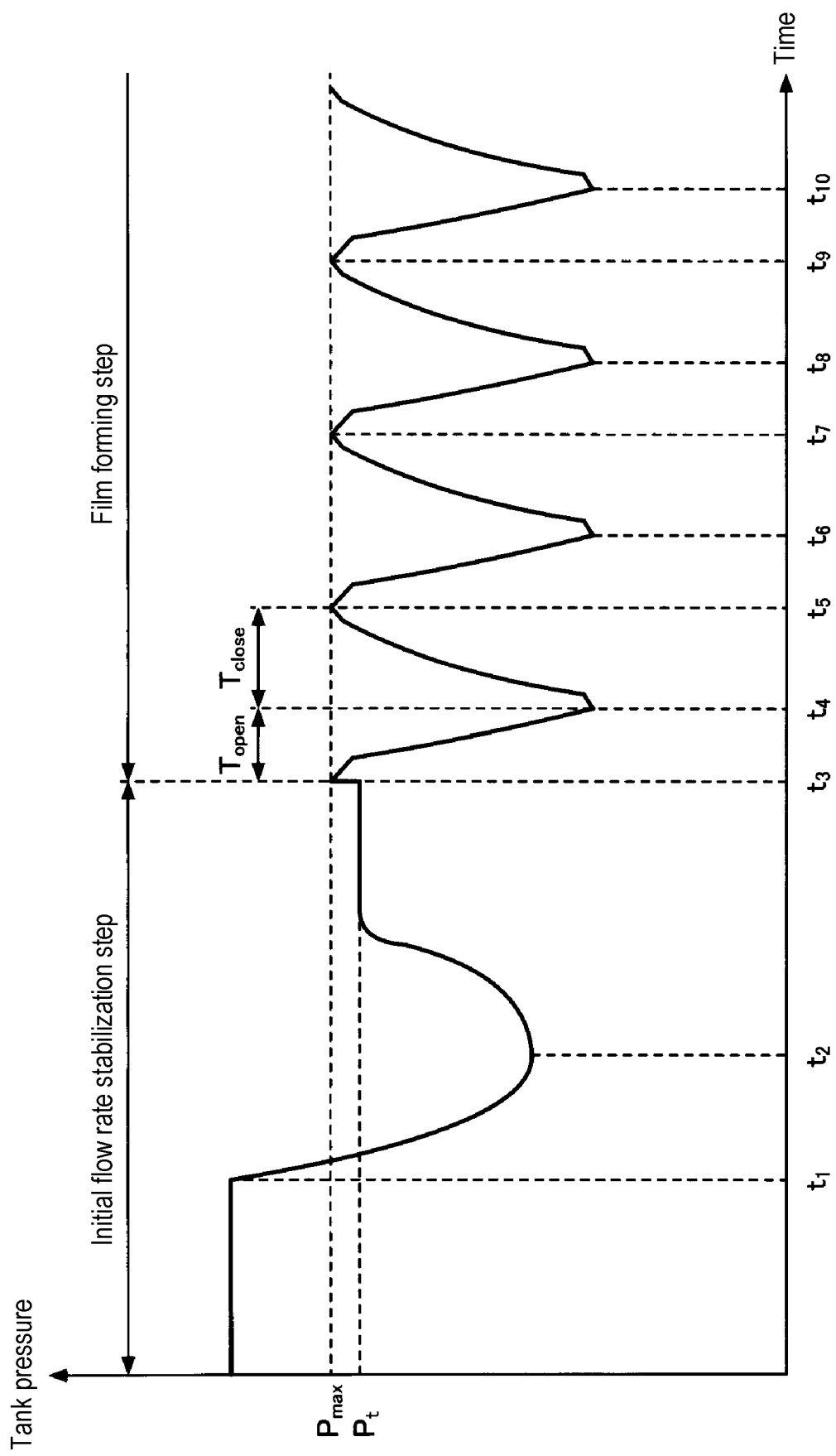
FIG. 3 is a view illustrating an example of a change in tank pressure in an initial flow rate stabilization step and a film formation step.

FIG. 3 is a view illustrating an example of a change in tank pressure in the initial flow rate stabilization step and the film formation step. In FIG. 3, the horizontal axis represents time and the vertical axis represents the tank pressure. In the initial flow rate stabilization step, at time $t_1$ in FIG. 3, the valve opening degree controller 120 controls the opening degree of the opening degree adjustment mechanism 105 from the "closed state" to the "fully-opened state". As a result, the $WCl_6$ gas in the storage tank 80 is exhausted by the exhaust mechanism 42 through the raw material exhaust path 104, and the tank pressure is lowered.

Subsequently, after the tank pressure becomes lower than the target value $P_t$, for example, at time $t_2$ after the lapse of a predetermined time from time $t_1$ in FIG. 3, the valve opening degree controller 120 controls the opening degree of the opening degree adjustment mechanism 105 between the "closed state" and the "fully-opened state" such that the tank pressure reaches the target value $P_t$ and is stabilized.

The target value $P_t$ is determined based on, for example, the tank pressure when the $WCl_6$ gas is supplied into the processing container 1 and the processing is executed in the processing container 1. When a first round of initial flow rate stabilization step is executed, the target value $P_t$ is determined based on, for example, the tank pressure in a dummy step executed prior to the first round of initial flow rate stabilization step. The dummy step is a step of supplying the $WCl_6$ gas into the processing container 1 in the same gas supply sequence as the film formation step, which will be described later, for example, in the state in which a dummy wafer is placed on the stage 2 of the processing container 1. When a second round and subsequent rounds of initial flow rate stabilization step are executed, the target value $P_t$ may preferably be the target value set in, for example, the previous film formation step. This makes it possible to reduce a variation between wafers W (wafer-to-wafer (W2W) variation).

For example, as illustrated in FIG. 3, the target value $P_t$ may preferably be a pressure smaller by a predetermined pressure than the maximum tank pressure $P_{max}$ when the $WCl_6$ gas is supplied into the processing container 1 and processing is performed in the processing container 1. The predetermined pressure is determined according to a delay time associated with the opening and closing of the opening degree adjustment mechanism 105 and the valve 73, which are caused when switching from the initial flow rate stabilization step to the film formation step, that is, when the supply destination of the $WCl_6$ gas is switched from the raw material exhaust path 104 to the gas supply line 61. However, when the valve 73 and the opening degree adjustment mechanism 105 are ALD valves and there is almost no delay time, the target value $P_t$ may be equal to the maximum tank pressure $P_{max}$ when the $WCl_6$ gas is supplied into the processing container 1 and processing is performed in the processing container 1.

As described above, in the initial flow rate stabilization step, the opening degree of the opening degree adjustment mechanism 105 is adjusted in parallel with the stabilization of the temperature of the wafer W on the stage 2 such that the tank pressure reaches the target value $P_t$ and is stabilized. As a result, it is possible to avoid a decrease in productivity due to the addition of the process of stabilizing the tank pressure at the target value $P_t$.

The film formation step is executed after the initial flow rate stabilization step is completed. In the film formation step, a film forming process of forming a tungsten film on the wafer W is performed. After the tank pressure is stabilized at the target value $P_t$ in the initial flow rate stabilization step, for example, at time $t_3$ in FIG. 3, the valve opening degree controller 120 controls the opening degree of the opening degree adjustment mechanism 105 to be in the "fully-closed state", and the controller 6 opens the valve 73. As a result, the $WCl_6$ gas stored in the storage tank 80 is supplied into the processing container 1 without being exhausted through the raw material exhaust path 104, and the tank pressure is lowered. At this time, it is preferable to synchronize the opening/closing timing of the opening degree adjustment mechanism 105 and the valve 73. This makes it possible to reduce a variation in the tank pressure when switching from the initial flow rate stabilization step to the film formation step. For example, it is possible to synchronize the opening/closing timing of the opening degree adjustment mechanism 105 and the valve 73 using the ALD valves as the opening degree adjustment mechanism 105 and the valve 73. At time $t_4$ after the lapse of a predetermined time $T_{open}$ after the valve 73 is opened, the controller 6 closes the valve 73. As a result, since the supply of the $WCl_6$ gas into the processing container 1 is stopped, the $WCl_6$ gas is stored in the storage tank 80, and the tank pressure becomes high. The predetermined time $T_{open}$ is a time determined based on a processing recipe or the like.

Subsequently, at time $t_5$ after a predetermined time $T_{close}$ after the valve 73 is closed, the controller 6 opens the valve 73. As a result, the $WCl_6$ gas stored in the storage tank 80 is supplied into the processing container 1, and the tank pressure is reduced. The predetermined time $T_{close}$ is a time determined based on a processing recipe or the like.

Thereafter, the $WCl_6$ gas is intermittently supplied into the processing container 1 by repeatedly opening and closing the valve 73. In FIG. 3, times $t_6$, $t_8$, and $t_{10}$ indicate the timings of closing the valve 73, and times $t_7$ and $t_9$ indicate the timings of opening the valve 73.

Since the film formation step is executed after the initial flow rate stabilization step, the tank pressure is stabilized at the target value $P_t$ at the start of the film formation step. As a result, the tank pressure at the start of film formation (time $t_3$) becomes substantially the same value as the tank pressure during film formation (times $t_5$, $t_7$, and $t_9$).

In addition, in the film formation step, the target value to be used in a subsequent round of initial flow rate stabilization step is set based on the tank pressure when the valve 73 is repeatedly opened and closed. For example, the target value to be used in the subsequent round of initial flow rate stabilization step is set based on a value obtained by averaging a predetermined number of times (e.g., ten times) of maximum tank pressures $P_{max}$ at the end when the valve 73 is repeatedly opened and closed.

Figure 4:
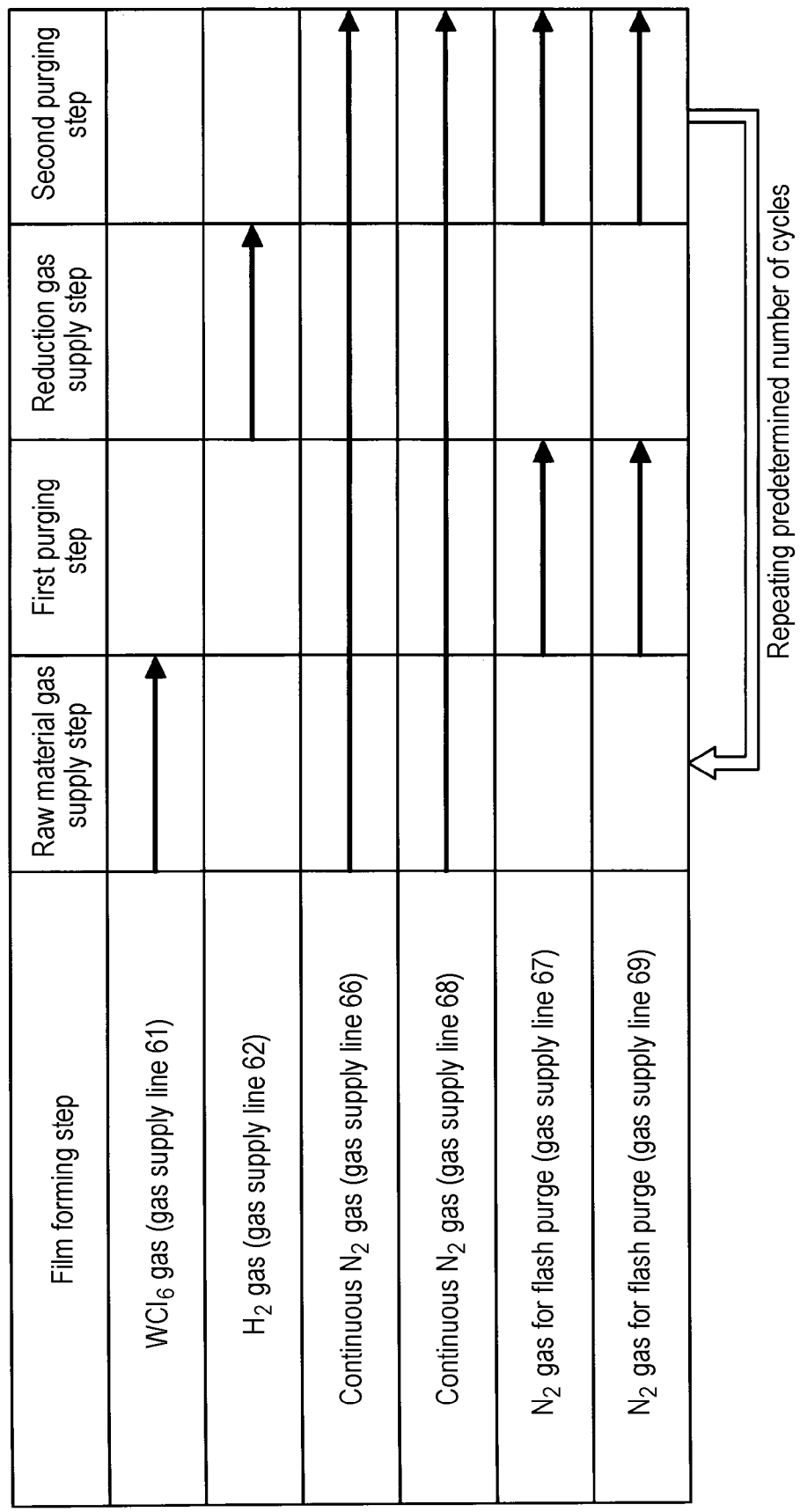
FIG. 4 is a view illustrating an example of a gas supply sequence in the film formation step.

FIG. 4 is a view illustrating an example of a gas supply sequence in the film formation step. As illustrated in FIG. 4, in the film formation step, by controlling the number of cycles, each cycle including a series of operations including a raw material gas supply step, a first purging step, a reduction gas supply step, and a second purging step, a tungsten film having a desired film thickness is formed.

The raw material gas supply step is a step of supplying the $WCl_6$ gas, which is a raw material gas, to the processing space 37. In the raw material gas supply step, first, in the state in which the valves 76 and 78 are opened, the $N_2$ gas is continuously supplied from the first purge gas source 54 and the second purge gas source 55 via the gas supply line 66 and the gas supply line 68. In addition, the valve 73 is opened to supply the $WCl_6$ gas from the raw material gas supply mechanism 51 to the processing space 37 via the gas supply line 61. In the raw material gas supply step, the $H_2$ gas used as a reduction gas may be supplied into the processing container 1 via the gas supply line 63 extending from the second reduction gas source 53. By supplying the reduction gas together with the $WCl_6$ gas in the raw material gas supply step, the supplied $WCl_6$ gas is activated so that a film formation reaction is likely to occur in a subsequent reduction gas supply step. Therefore, it is possible to maintain a high step coverage and increase a thickness of film deposited per cycle, thus increasing a film formation rate. The flow rate of the reduction gas may be set to such a flow rate that CVD reaction does not occur in the raw material gas supply step.

The first purging step is a step of purging excessive $WCl_6$ gas or the like in the processing space 37. In the first purging step, in the state in which the supply of the $N_2$ gas is continued through the gas supply line 66 and the gas supply line 68, the valve 73 is closed to stop the supply of the $WCl_6$ gas. Further, by opening the valves 77 and 79, the $N_2$ gas ($N_2$ gas for flash purging) is also supplied from the gas supply line 67 and the gas supply line 69, and the excessive WCl$_6$ gas in the processing space 37 or the like is purged by a large flow rate of the N$_2$ gas. However, the supply of the N$_2$ gas for flush purging may be omitted.

The reduction gas supply step is a step of supplying the H$_2$ gas, which is a reduction gas, to the processing space 37. In the reduction gas supply step, the valves 77 and 79 are closed to stop the supply of the N$_2$ gas from the gas supply line 67 and the gas supply line 69. In addition, in the state in which the supply of the N$_2$ gas is continued through the gas supply line 66 and the gas supply line 68, the valve 74 is opened. As a result, the H$_2$ gas as a reduction gas is supplied to the processing space 37 from the first reduction gas source 52 via the gas supply line 62. At this time, the H$_2$ gas is temporally stored in the storage tank 81 and then supplied into the processing container 1. The WCl$_6$ gas adsorbed on the wafer W is reduced through the reduction gas supply step. The flow rate of the H$_2$ gas at this time may be set to such an amount that sufficiently causes a reduction reaction.

The second purging step is a step of purging excessive H$_2$ gas in the processing space 37. In the second purging step, in the state in which the supply of the N$_2$ gas through the gas supply line 66 and the gas supply line 68 is continued, the valve 74 is closed to stop the supply of the H$_2$ gas from the gas supply line 62. Further, by opening the valves 77 and 79, the N$_2$ gas (N$_2$ gas for flash purging) is also supplied from the gas supply line 67 and the gas supply line 69, and the excessive H$_2$ gas in the processing space 37 is purged by a large flow rate of the N$_2$ gas. However, the supply of the N$_2$ gas for flush purging may be omitted.

By controlling the number of cycles, each cycle including a series of operations having the raw material gas supply step, the first purging step, the reduction gas supply step, and the second purging step described above, it is possible to form a tungsten film having a desired film thickness.

The unloading step is executed after the film formation step is completed. In the unloading step, the gate valve 12 is opened in the state in which the stage 2 is lowered to the transfer position, and the wafer W is unloaded outward of the processing container 1 through the loading/unloading port 11 by a transfer robot (not illustrated).

When there is a subsequent wafer W to be processed, the loading step begins again after the unloading step, and the initial flow rate stabilization step, the film formation step, and the unloading step are performed. In this manner, it is possible to form a tungsten film having a desired film thickness on the subsequent wafer W.

As described above, according to the embodiment, in the case of forming the tungsten film by supplying the WCl$_6$ gas into the processing container 1, the opening degree of the opening degree adjustment mechanism 105 is adjusted such that the tank pressure reaches the target value and is stabilized while the WCl$_6$ gas is exhausted through the raw material exhaust path 104 prior to the film formation. The target value is determined based on the tank pressure when the WCl$_6$ gas is supplied into the processing container 1 and the processing is executed in the processing container 1. As a result, the tank pressure at the start of film formation becomes substantially the same value as the tank pressure during film formation. In other words, it is possible to adjust the tank pressure at the start of film formation to the tank pressure during film formation. Therefore, a difference (variation) between the tank pressure immediately after the start of film formation and the tank pressure for the subsequent period during film formation is reduced. This makes it possible to reduce the difference (variation) between the flow rate of the WCl$_6$ gas immediately after the start of film formation and the flow rate of the WCl$_6$ gas for the subsequent period during film formation. As described above, according to the embodiment, the flow rate of the WCl$_6$ gas at the start of film formation can be stabilized in a short time.

In addition, according to the embodiment, when the tungsten film is continuously formed on a plurality of wafers W, for example, when the second round and subsequent rounds of initial flow rate stabilization step are performed, the target value may be the target value set in the previous round of film formation step. This makes it possible to adjust the tank pressure at the start of film formation to the tank pressure set based on the latest film formation step. As a result, since it is possible to adjust the flow rate of the WCl$_6$ gas at the start of film formation to the flow rate of the WCl$_6$ gas in the latest film formation step, it is possible to reduce the variation in the flow rate of the WCl$_6$ gas between the wafers W. In particular, by setting the target value to be used in the initial flow rate stabilization step based on a value obtained by averaging a predetermined number of times of tank pressures at the end of the latest film formation step, it is possible to adjust the tank pressure at the start of film formation to the tank pressure at the end of the latest film formation step. Thus, it is possible to further reduce the variation in the flow rate of the WCl$_6$ gas between the wafers W.

Further, according to the embodiment, by adjusting the opening degree of the opening degree adjustment mechanism 105, the conductance of the raw material exhaust path 104 is controlled and the internal pressure of the storage tank 80 is controlled. Therefore, the internal pressure of the storage tank 80 may be adjusted in a wide range. In addition, since the pressure is not adjusted by introducing external gas into the raw material exhaust path 104, it is possible to reduce the influence of the turbulence of gas flow in the raw material exhaust path 104.

It should be noted that the embodiments disclosed herein are exemplary in all respects and are not restrictive. The above-described embodiments may be omitted, replaced or modified in various forms without departing from the scope and spirit of the appended claims.

In the embodiments described above, the case in which the initial flow rate stabilization step is started after the loading step is completed has been illustrated, but the present disclosure is not limited thereto. The start timing of the initial flow rate stabilization step may be any timing as long as it is performed before the film formation step. For example, the initial flow rate stabilization step may be started before the loading step, may be started at the same time as the start of the loading step, or may be started in the middle of the loading step. In this way, by starting the initial flow rate stabilization step before the loading step is completed, it is possible to perform the loading step and the initial flow rate stabilization step at the same time. Thus, it is possible to shorten the time until the film formation step, thus improving productivity.

In the embodiments described above, the case in which the valve opening degree controller 120 adjusts the opening degree of the opening degree adjustment mechanism 105 has been described as an example, but the present disclosure is not limited thereto. For example, the controller 6 may adjust the opening degree of the opening degree adjustment mechanism 105 instead of the valve opening degree controller 120.

In the embodiments described above, the case in which the valve opening degree controller 120 adjusts the opening degree of the opening degree adjustment mechanism 105 based on the internal pressure of the storage tank 80 as the internal pressure of the gas supply line 61 has been described as an example, but the present disclosure is not limited thereto. For example, in a case in which the storage tank 80 is not provided in the gas supply line 61, a pressure sensor may be provided in the gas supply line 61 and the valve opening degree controller 120 may adjust the opening degree of the opening degree adjustment mechanism 105 based on a value detected by the pressure sensor.

In the embodiments described above, the case in which the tungsten film is formed using the $WCl_6$ gas as a raw material gas has been described as an example, but the present disclosure is not limited thereto. For example, another tungsten chloride gas, such as a $WCl_5$ gas, may be used. Even if the $WCl_5$ gas is used, the behavior thereof is almost the same as that of the $WCl_6$ gas. When the $WCl_5$ gas is used, $WCl_5$, which is solid at normal temperature, may be used as a film forming material. The present disclosure is also applicable to, for example, a case in which a molybdenum film is formed using a molybdenum chloride gas or a case in which a tantalum film is formed using a tantalum chloride gas. In these cases, molybdenum chloride or tantalum chloride, which is solid at room temperature, may be used as a raw material for film formation. In the embodiments described above, a solid raw material is sublimated to generate a raw material gas, but a liquid raw material may be evaporated to generate a raw material gas.

In the embodiments described above, the case in which the $H_2$ gas is used as a reduction gas has been described as an example, but the present disclosure is not limited thereto. In addition to the $H_2$ gas, a reduction gas, such as a $SiH_4$ gas, a $B_2H_6$ gas, or a $NH_3$ gas, may also be used. Among the $H_2$ gas, the $SiH_4$ gas, the $B_2H_6$ gas, and the $NH_3$ gas, two or more gases may be supplied. Furthermore, other reduction gases other than these gases, for example, a $PH_3$ gas and a $SiH_2Cl_2$ gas may be used. From the viewpoint of further reducing impurities in a film to obtain a low resistance value, it is preferable to use the $H_2$ gas. In addition, as a purge gas and a carrier gas, instead of the $N_2$ gas, another inert gas, such as an Ar gas, may be used.

In the embodiments described above, the semiconductor wafer has been described as an example of a substrate, but the semiconductor wafer may be a silicon wafer, or a compound semiconductor wafer of GaAs, SiC, GaN, or the like. Furthermore, the substrate is not limited to the semiconductor wafer, and the present disclosure may be applied to a glass substrate used for a flat panel display (FPD) of a liquid crystal display device or the like, a ceramic substrate, or the like.

According to the present disclosure, it is possible to stabilize a flow rate of a raw material gas at the start of film formation in a short time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A raw material supply apparatus comprising:
   a raw material tank containing a raw material gas;
   a raw material supply path through which the raw material gas is supplied from the raw material tank into a processing container;
   a storage tank provided in the raw material supply path and configured to store the raw material gas;
   a valve provided in the raw material supply path;
   a pressure sensor configured to detect an internal pressure of the storage tank;
   a raw material exhaust path connected to the raw material supply path downstream of the storage tank and through which the raw material gas in the raw material supply path is exhausted;
   an opening degree adjustment mechanism provided in the raw material exhaust path and configured to control the internal pressure of the raw material supply path and the storage tank based on an adjustment of an opening degree of the opening degree adjustment mechanism; and
   a controller configured to perform the adjustment of the opening degree of the opening degree adjustment mechanism based on a first value detected by the pressure sensor.

2. The raw material supply apparatus of claim 1, wherein the controller is configured to adjust the opening degree of the opening degree adjustment mechanism such that the first value of the internal pressure detected by the pressure sensor reaches a target value and the internal pressure is stabilized while the raw material gas is exhausted through the raw material exhaust path.

3. The raw material supply apparatus of claim 2, wherein the target value is determined based on a second value detected by the pressure sensor when the raw material gas is supplied into the processing container and a processing is executed in the processing container.

4. The raw material supply apparatus of claim 3, wherein the controller is configured to adjust the opening degree of the opening degree adjustment mechanism in a state in which a substrate is accommodated in the processing container.

5. The raw material supply apparatus of claim 4, wherein the opening degree adjustment mechanism includes:
   an air-operated valve configured to open and close a valve body by an air pressure; and
   an electro-pneumatic regulator configured to adjust an air pressure introduced into the air-operated valve,
   wherein the controller is configured to control the electro-pneumatic regulator to adjust an opening degree of the air-operated valve.

6. The raw material supply apparatus of claim 5, wherein the air-operated valve is an atomic layer deposition (ALD) valve.

7. The raw material supply apparatus of claim 6, wherein the valve is an atomic layer deposition (ALD) valve.

8. The raw material supply apparatus of claim 7, wherein the raw material gas is generated by sublimation of a solid raw material or evaporation of a liquid raw material.

9. The raw material supply apparatus of claim 1, wherein the controller is configured to adjust the opening degree of the opening degree adjustment mechanism such that the first value of the internal pressure detected by the pressure sensor reaches a target value and the internal pressure is stabilized while the raw material gas is exhausted through the raw material exhaust path.

10. The raw material supply apparatus of claim 1, wherein the controller is configured to adjust the opening degree of the opening degree adjustment mechanism in a state in which a substrate is accommodated in the processing container.

11. The raw material supply apparatus of claim 1, wherein the opening degree adjustment mechanism includes:
    an air-operated valve configured to open and close a valve body by an air pressure; and
    an electro-pneumatic regulator configured to adjust an air pressure introduced into the air-operated valve,
    wherein the controller is configured to control the electro-pneumatic regulator to adjust an opening degree of the air-operated valve.

12. The raw material supply apparatus of claim 1, wherein the valve is an atomic layer deposition (ALD) valve.

13. The raw material supply apparatus of claim 1, wherein the raw material gas is generated by sublimation of a solid raw material or evaporation of a liquid raw material.

14. A film forming apparatus comprising:
    a processing container; and
    a raw material supply apparatus configured to supply a raw material gas into the processing container,
    wherein the raw material supply apparatus includes:
    a raw material tank containing the raw material gas;
    a raw material supply path through which the raw material gas is supplied from the raw material tank into the processing container;
    a storage tank provided in the raw material supply path and configured to store the raw material gas;
    a valve provided in the raw material supply path;
    a pressure sensor configured to detect an internal pressure of the storage tank;
    a raw material exhaust path connected to the raw material supply path downstream of the storage tank and through which the raw material gas in the raw material supply path is exhausted;
    an opening degree adjustment mechanism provided in the raw material exhaust path and configured to control the internal pressure of the raw material supply path and the storage tank based on an adjustment of an opening degree of the opening degree adjustment mechanism; and
    a controller configured to perform the adjustment of the opening degree of the opening degree adjustment mechanism based on a value detected by the pressure sensor.

* * * * *